United States Patent [19]

Canning

[11] Patent Number: 5,393,707
[45] Date of Patent: Feb. 28, 1995

[54] SEMICONDUCTOR - SLICE CLEAVING

[75] Inventor: Kevin Canning, Paignton, United Kingdom

[73] Assignee: Northern Telecom Limited, Montreal, Canada

[21] Appl. No.: 93,766

[22] Filed: Jul. 19, 1993

[30] Foreign Application Priority Data

Jul. 31, 1992 [GB] United Kingdom ............... 9216363

[51] Int. Cl.6 ................................. H01L 21/304
[52] U.S. Cl. ................ 437/226; 148/DIG. 28; 437/129
[58] Field of Search ............... 437/226; 148/DIG. 28

[56] References Cited

U.S. PATENT DOCUMENTS

| 4,469,500 | 9/1984 | Miller | 65/112 |
|---|---|---|---|
| 4,590,667 | 5/1986 | Simon | 437/226 |
| 5,128,282 | 7/1992 | Ormond et al. | 437/226 |
| 5,174,188 | 12/1992 | Petroz | 83/882 |
| 5,272,114 | 12/1993 | van Berkum et al. | 437/226 |

FOREIGN PATENT DOCUMENTS

| 0402230 | 12/1990 | European Pat. Off. | |
|---|---|---|---|
| 21040 | 2/1984 | Japan | 437/226 |
| 90940 | 5/1984 | Japan | 437/226 |
| 192541 | 7/1992 | Japan | 437/226 |

*Primary Examiner*—R. Bruce Breneman
*Assistant Examiner*—Linda J. Fleck
*Attorney, Agent, or Firm*—Lee, Mann, Smith, McWilliams, Sweeney & Ohlson

[57] ABSTRACT

Cleavage of a semiconductor slice is initiated at a peckmark formed in the upper surface at one edge of the slice by bending the slice over a cutting edge of a semiconductor slice dicing wheel. The cleave is propagated to the far edge of the slice by relative sliding movement of the wheel across the underside of the slice.

6 Claims, 2 Drawing Sheets

SEMICONDUCTOR - SLICE CLEAVING

BACKGROUND OF THE INVENTION

This invention relates to the cleaving of single crystal semiconductor slices.

In the manufacture of semiconductor lasers it is known to make a two-dimensional array of such lasers on a slice which is cleaved up into bars each comprising a single line of lasers which is subsequently subdivided into dice each comprising a single laser chip. In the case of Fabry Perot cavity semiconductor lasers the optical cavity is located between a pair of plane parallel facets, and typically these plane facets are provided by the facets resulting from the cleaving operations that is used to divide the slice up into its component bars.

A known method of cleaving a semiconductor slice up into lasers first involves marking the edge of the slice to create localised damage from which to initiate a fracture, Such marks, hereinafter referred to as pack marks, are made at a spacing equal to the desired width of the bars. The marked slice is mounted on a plastics film stretched across a frame. The stretched film is lowered by hand on to a cleaving blade that is aligned with the desired cleavage plane of the slice and is registered with one of the peck marks, and the lowering is continued until such time as the slice cleaves along the line of the blade. The frame is indexed one bar width to the next peck mark, and is lowered once again on to the cleaving blade to repeat the cleaving process. With exercise of reasonable skill and attention this cleaving process is satisfactorily applied to the cleaving of bars up to approximately 2 cm long from a nominally 100 $\mu$m thick InP/GaInAsP slice of laser devices, but is found progressively more difficult to achieve satisfactory yields as the length of the bars increases. The problem that is encountered with the cleaving of longer bars is the tendency for the cleave to have a number of terraces where the cleave is divided into a number of sections in which cleaving proceeds in the intended direction, these sections being linked staircase-fashion by much shorter sections in which the cleave has proceeded at right angles to the intended direction. These linking sections are undesirable because they detract from uniformity of laser cavity length for the members of any bar, and also because of yield problems associated with the chance of a linking section being formed in a region registering with the active part of a laser.

SUMMARY OF THE INVENTION

The cleaving method of the present invention has some similarities with both these prior art cleaving methods, however, it does not involve making scribe lines across the face of the slice, but instead promotes cleavage in the desired plane rather than in a perpendicular plane by using a specially shaped cleaving blade rather than a cleaving point.

According to the present invention there is provided a method of cleaving a single crystal semiconductor slice including the steps of providing a fracture initiation zone at the edge of the slice, causing the slice to bend against a curved cleaving blade positioned to register with said zone and of causing relative movement between the slice and the blade in a cleavage direction so as to cause cleavage initiated by said bending to propagate from said zone to the opposite edge of the slice.

The invention also provides a method of cleaving a single crystal semiconductor slice including the steps of marking an edge of the slice to produce a localised fracture initiation zone at the edge of the slice, of bending the slice over a cleaving tool positioned to register with said zone until the slice begins to cleave, and of moving, relative the slice, the cleaving tool across the surface of the slice in a direction substantially aligned with the cleavage direction so as to cause the cleavage to propagate from said zone to the opposite edge of the slice, wherein the cleaving tool has the form of a cleaving blade whose blade edge is curved in the plane of the blade with a radius of curvature that is large compared with its radius of curvature perpendicular to that plane, and wherein the plane of the blade is substantially aligned with said direction of relative movement.

The invention further provides a method of making a plurality of discrete injection laser chips in which a monolithic two-dimensional array of injection laser devices is fabricated in a slice of single crystal semiconductive material by a process that includes the epitaxial deposition of a plurality of semiconductive layers upon a single crystal substrate, in which the slice is cleaved into a plurality of bars each containing a linear array of injection laser devices, and in which the bars are subsequently diced up into individual laser chips, wherein said cleaving of the slice into bars is performed by marking an edge of the slice to produce a set of localised fracture initiation zones at the edge of the slice and, at each of said marks, bending the slice over a cleaving tool positioned to register with that mark until the slice begins to cleave and moving the tool relative the slice across the surface of the slice in a direction substantially aligned with the cleavage direction so as to cause the cleave to propagate from said mark to the opposite edge of the slice, wherein the cleaving tool has the form of a cleaving blade whose blade edge is curved in the plane of the blade with a radius of curvature that is large compared with its radius of curvature perpendicular to that plane, and wherein the plane of the blade is substantially aligned with said direction of relative movement.

BRIEF DESCRIPTION OF THE DRAWINGS

There follows a description of the cleaving into bars of a single crystal InP/GaInAsP slice which has been electroded on both faces subsequent to the formation of a two-dimensional array of injection lasers by vapour phase epitaxy upon the face of the slice. The description refers to the accompanying drawings, in which.

DETAILED DESCRIPTION OF THE PREFERRED EMBODIMENT

Figure 1:
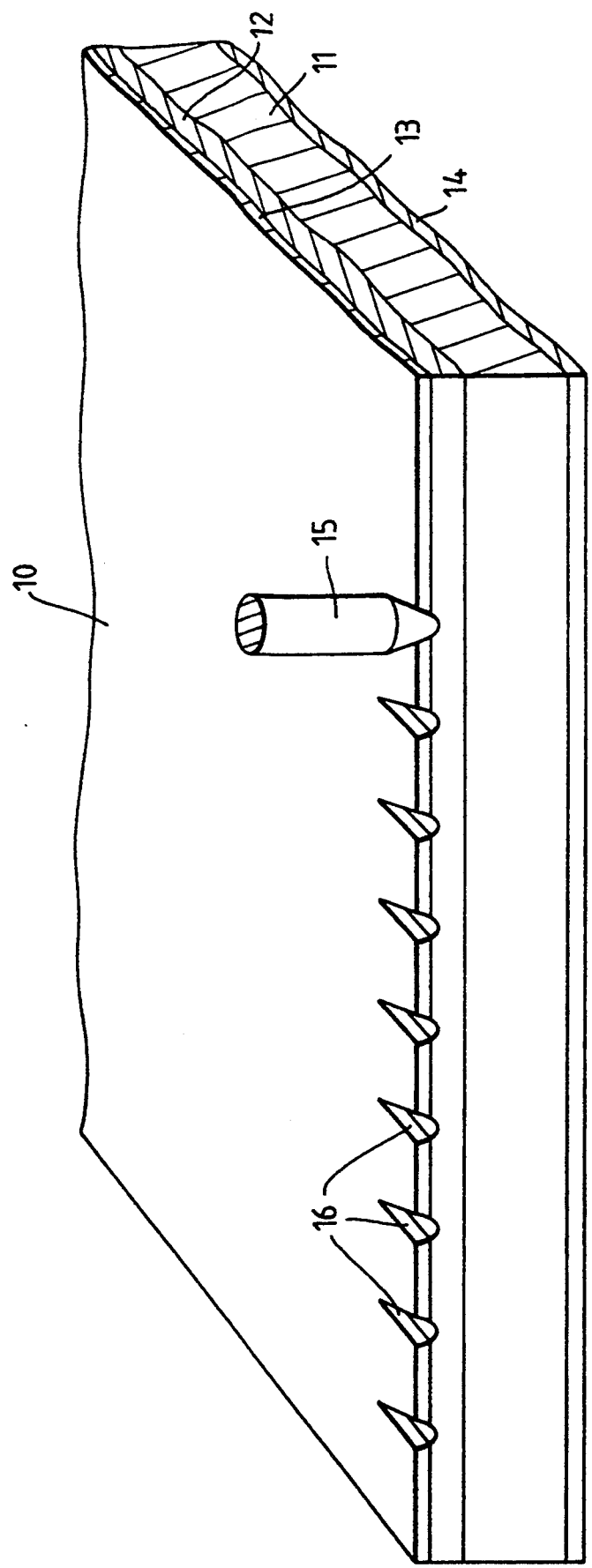
FIG. 1 is a schematic perspective view of a corner of the slice.

Referring to FIG. 1, a semiconductor slice, indicated generally at 10, comprises a single crystal substrate 11 of indium phosphate upon which material 12 has been grown by vapour phase epitaxy and structured to provide a two-dimensional array of injection laser devices. The two major faces of the slice have been covered with layers 13 and 14 of metallisation to provide electrodes for the lasers. The total thickness of the slice typically lies in the range 80 $\mu$m to 140 $\mu$m excluding metallisation, and the metallisation, which is typically gold, typically adds a further 1 μm.

A diamond tipped scribe 15 with a conical point having a tip radius of 2.5 μm is used to make a series of peck-marks 16 along one edge of the slice. The choice of a small radius tip allows the scribe to penetrate right through the metallisation 13 and just into the underlying epitaxially deposited material 12 with the minimum of damage to the slice. The peck-marks serve the dual function of providing localised fracture initiation zones at the edge of the crystalline slice at which cleavage is readily initiated, and they also establish points from which the overlying metallisation 13 can readily tear during cleaving. The peck-marks are spaced at intervals equal to the width of the bars to be formed by cleaving, each is aligned with the intended cleaving direction and typically extends for a total distance of about 500 μm.

Figure 2:
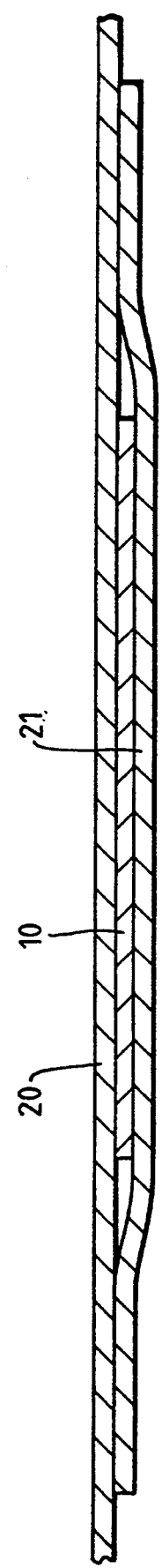
FIG. 2 is a schematic cross-section of the slice of FIG. 1 when mounted on a stretched plastics film.

The peck-marked slice is placed peck-marks face-down on a stretched plastics film 20 (FIG. 2) stretched taut across a frame (not shown). The slice is then covered with a further plastics film 21 which has a releasable lightly adhesive surface on one face, the face adjacent the slice 10 and the stretched film 20. In this way the slice 10 is temporarily secured to the stretched film in a manner that allows the assembly as depicted in FIG. 2 to be inverted so that the slice lies suspended beneath the stretched film 20. Preferably both plastics films 20 and 21 are see-through films permitting, not only the slice to be viewed from above in a microscope, (not shown) but also the cleaving tool (shortly to be described with reference to FIG. 3) located beneath the slice. The stretched film 20 may conveniently be a 125 μm thick polymide film of the type used as the carrier for drawings in projection display systems, while the film 21 with the releasable lightly adhesive surface may conveniently be the material sold by Nitto (UK) Ltd. under the designation NITTO film.

Figure 3:
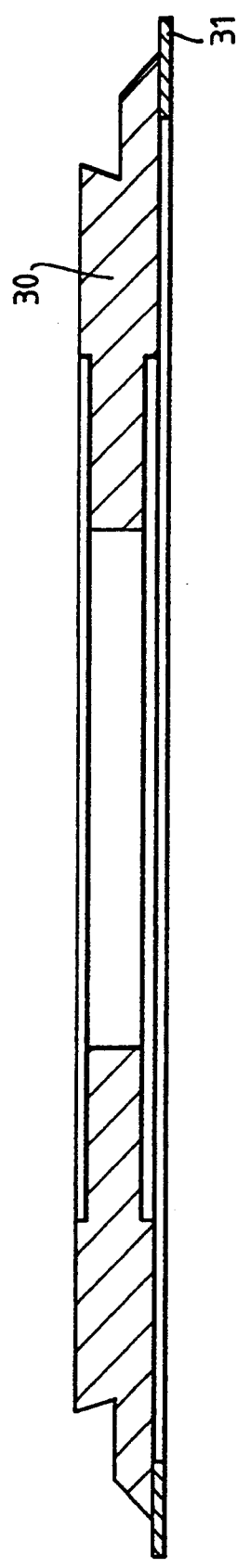
FIG. 3 is a schematic cross-section of the disc cleaving tool employed to cleave the slice of FIGS. 1 and 2 into bars.

Referring now to FIG. 3, the cleaving tool has the form of a cleaving blade whose blade edge is curved in the plane of the blade. A preferred form of blade is that of a diamond impregnated nickel dicing wheel such as is used for dicing up semiconductor slices by sawing. The wheel illustrated in FIG. 3 has aluminum disc 30 about 55 mm in diameter, to one side of which is bonded an annular blade 31 of nickel impregnated with diamond which is about 40 to 50 μm thick and is about 1.5 mm larger in external diameter than its supporting disc 30.

The frame carrying the stretched film 20, and the slide 10 attached to it by the film 21, is mounted in a carriage (not shown) providing precision transitional movements in the mutually perpendicular x- and y-directions lying in the plane of the stretched film 20, and also a rotational movement about a theta axis that is perpendicular to that plane. The cutting wheel is mounted on a second carriage (not shown) that provides a precision translational movement in the z-direction that is aligned with the theta axis and thus is perpendicular to the plane of the stretched film. The wheel, which is not designed to rotate during cleaving, is mounted on the second carriage with its axis aligned with the y-direction of the first carriage. The x-direction therefore lies in the plane of the blade 31.

The frame carrying the stretched film 20 is rotated about its theta axis until the desired cleaving plane in the slice 10 is aligned with the x-direction, and thus is aligned with the plane of the cleaving blade 31, and the x-, y- and z-direction movements are adjusted to raise the blade 31 until it slightly deforms the film 20 in a region immediately adjacent a selected one of the peck-marks 16. At this stage the x-direction movement is slowly adjusted to draw the slice 10 across the top of the blade 31. In this way a fracture is initiated at the selected peck-mark and then caused to propagate in a controlled manner right across to the far side of the slice 10. In the propagation of the fracture of the slice 10 from one side to the other there is in this particular example no direct contact between the slice and the blade, and the film 21 merely slides along the blade under relatively light pressure providing virtually no wear of the blade. At the end of one cleaving operation the wheel is lowered on its z-direction movement, and the x-direction movement is restored to its former positions while the y-direction movement is indexed across the distance between adjacent pairs of peck-marks. At this stage the wheel 30 may be raised to its former height preparatory to making the next cleaving operation. The process is repeated for each peck-mark position so as to divide the slice into its component bars.

We have found that a reasonably skilled and experienced operator can satisfactorily manually cleave over a straight knife-edge 20 mm long 100 μm thick electroded bars of InP/GaInAsP 200 μm wide, or of GaAs/GaAIAs 500 μm wide, without providing an unacceptably large number of cleaves with the above mentioned terracing. However in each case, as the length of the bar is increased, so the yield goes down, and by the time the bar length has been increased to about 35 to 40 mm, the success rate is so low that very few bars from a single slice are devoid of terraces in their cleaved facets. This contrasts strongly with cleaving using the curved knife edge of the present invention where for instance no difficulty has been encountered in cleaving 50 mm long 500 μm wide 100 μm thick bars of GaAs/GaAIAs devoid of terraces.

The reason for the improved yield is not fully understood but is believed to be attributable to the fact that the curved blade provides an effective line contact with the slide whose length is much greater than its width and yet much shorter than the total length of the cleave, and that thereby a relatively highly anisotropic stress field is set up in the slice that greatly favours stress relief by cleaving along the desired plane at the expense of cleaving along a plane perpendicular to the plane.

I claim:

1. A method of cleaving a single semiconductor slice including the steps of providing a fracture initiation zone at an edge of the slice, causing the slice to bend against a planar cleaving blade having a curved cleaving edge positioned to register with said zone and of causing relative movement between the slice and and the curved edge of the blade in a cleavage direction so as to cause cleavage initiated by said bending to propagate from said zone to the opposite edge of the slice.

2. A method of cleaving a single crystal semiconductor slice including the steps of marking an edge of the slice to produce a localised fracture initiation zone at the edge of the slice, of bending the slice over a cleaving tool positioned to register with said zone until the slice begins to cleave, and of moving, relative the slice, the cleaving tool across the surface of the slice in a direction substantially aligned with the cleavage direction so as to cause the cleavage to propagate from said zone to the opposite edge of the slice, wherein the planar cleaving tool has the form of a planar cleaving blade whose blade edge is curved in the plane of the blade with a radius of curvature that is large compared with its radius of curvature perpendicular to that plane, and wherein the plane of the blade is substantially aligned with said direction of relative movement.

3. A method of making a plurality of discrete injection laser chips in which a monolithic two-dimensional array of injection laser devices is fabricated in a slice of single crystal semiconductive material by a process that includes the epitaxial deposition of a plurality of semiconductive layers upon a single crystal substrate, in which the slice is cleaved into a plurality of bars each containing a linear array of injection laser devices, and in which the bars are subsequently diced up into individual laser chips, wherein said cleaving of the slice into bars is performed by marking an edge of the slice to produce a set of localised fracture initiation zones at the edge of the slice and, at each of said marks, bending the slice over a cleaving tool positioned to register with that mark until the slice begins to cleave and moving the tool relative the slice across the surface of the slice in a direction substantially aligned with the cleavage direction so as to cause the cleave to propagate from said mark to the opposite edge of the slice, wherein the cleaving tool has the form of a planar cleaving blade whose blade edge is curved in the plane of the blade with a radius of curvature that is large compared with its radius of curvature perpendicular to that plane, and wherein the plane of the blade is substantially aligned with said direction of relative movement.

4. A method as claimed in claim 1, wherein a film of material is interposed between the cleaving blade and the slice, which film prevents the cleaving blade from directly contacting the slice during cleaving.

5. A method as claimed in claim 2, wherein a film of material is interposed between the cleaving blade and the slice, which film prevents the cleaving blade from directly contacting the slice during cleaving.

6. A method as claimed in claim 3, wherein a film of material is interposed between the cleaving blade and the slice, which film prevents the cleaving blade from directly contacting the slice during cleaving.

* * * * *